(12) United States Patent
Powell (10) Patent No.: US 9,553,572 B2
(45) Date of Patent: Jan. 24, 2017

(54) SELF CLOCKING COMPARATOR FOR A CHARGE PUMP (71) Applicant: SILICON LABORATORIES INC., Austin, TX (US)

(72) Inventor: Matthew R. Powell, Austin, TX (US)

(73) Assignee: SILICON LABORATORIES INC., Austin, TX (US)

( * ) Notice: Subject to any disclaimer, the term of this patent is extended or adjusted under 35 U.S.C. 154(b) by 120 days.

(21) Appl. No.: 14/546,630

(22) Filed: Nov. 18, 2014

(65) Prior Publication Data

US 2016/0142046 A1 May 19, 2016

(51) Int. Cl.
*H03L 5/00* (2006.01)
*H03K 5/24* (2006.01)
*H02M 3/07* (2006.01)
*H03K 5/01* (2006.01)

(52) U.S. Cl.
CPC ............ *H03K 5/249* (2013.01); *H02M 3/07* (2013.01); *H03K 5/01* (2013.01)

(58) Field of Classification Search
CPC .................................................. H03K 5/249
USPC .................................. 327/306–333; 341/155
See application file for complete search history.

(56) References Cited

U.S. PATENT DOCUMENTS

| 7,180,805 B2 * | 2/2007 | Schnabel | G11C 7/04 365/211 |
| 7,977,979 B2 * | 7/2011 | Cho | H03F 3/45475 327/63 |
| 2016/0118882 A1 * | 4/2016 | Savanth | G01R 19/0084 324/76.11 |

* cited by examiner

*Primary Examiner* — Lincoln Donovan
*Assistant Examiner* — Metasebia Retebo
(74) *Attorney, Agent, or Firm* — Gary Stanford (57) ABSTRACT

A self clocking comparator for clocking a charge pump providing a high voltage output including multiple gain stages and a reset circuit. The gain stages are configured to assert the compare voltage at a first voltage level in a default state when the sense voltage is greater than the reference voltage, and to assert the compare voltage to a second voltage level in a reset state when the sense voltage falls below the reference voltage. The reset circuit resets, or otherwise forces, the gain stages back to the default state in response to the compare voltage transitioning to the second voltage level. The compare voltage oscillates while the sense voltage is less than the reference voltage at a frequency based on a magnitude of a difference between the sense voltage and the reference voltage up to a predetermined maximum frequency level.

20 Claims, 3 Drawing Sheets

SELF CLOCKING COMPARATOR FOR A CHARGE PUMP

BACKGROUND OF THE INVENTION

Field of the Invention

The present invention relates in general to charge pump configurations, and more particularly to a self clocking comparator for providing pump clocks to drive a charge pump.

Description of the Related Art

In order to perform useful functions at a normal chip current level (e.g., on the order of microamperes, μA), it is sometimes useful to generate a voltage larger than the highest supply voltage provided to the chip. This is especially true when the minimum specified supply voltage for the part is quite low. The supply voltage may be as low as 1 to 2 Volts (V), such as, for example, about 1.6 Volts (V). A charge pump can generate a voltage larger than the supply voltage, but it is challenging to operate one efficiently at low current levels (e.g., in the nanoampere (nA) range).

A charge pump may use switched capacitors to generate a voltage higher than the supply voltage. A digital clock is needed to control the phases of switches connecting capacitors between ground (GND, or VSS), the supply voltage (e.g., VDD), an output voltage, and/or any other potential levels. The generated voltage can be controlled either by continuously switching or pumping the capacitors and regulating the resulting voltage down to the desired level, or by only pumping as needed such as by gating a separate pump clock that controls the capacitor switching and directly using the switched capacitor output.

A comparator regulates the charge pump output by monitoring and comparing the output to a desired level and generating a digital signal. The use of the charge pump output voltage generally draws current from the developed voltage. To keep the output at the desired level, the charge pump has to be able to provide this current. The frequency that the capacitors can switch multiplied by the size of those capacitors is proportional to the current that can be provided.

The comparator has some delay so that when the inputs cross each other such that the output of the comparator is expected to change, there is some delay in time before the comparator output does, in fact, change. In the classic configuration where the comparator output gates an independent clock source, at some point the output rises above the desired level and continues rising for a period of time related to the delay through the comparator. This voltage excursion is related to the capacitor switching frequency multiplied by the size of the capacitors so it is proportional to the maximum current that can be provided by the charge pump. If the voltage excursion is too large, the charge pump output tends to oscillate back and forth causing the control loop to unstable or nearly unstable. This imposes a limit on how much delay can be tolerated in the comparator to support a given amount of current out of the charge pump. The delay requirement in the comparator determines the current that may be consumed in the comparator.

SUMMARY OF THE INVENTION

A self clocking comparator for clocking a charge pump providing a high voltage output according to one embodiment includes multiple gain stages and a reset circuit. The gain stages have a first input that receives a sense voltage indicative of the high voltage output of the charge pump, have a second input that receives a reference voltage, have a reset input, and have an output providing a compare voltage. The gain stages assert the compare voltage to a first voltage level in a default state when the sense voltage is greater than the reference voltage, and assert the compare voltage to a second voltage level in a reset state when the sense voltage is less than the reference voltage. The reset circuit has an input receiving the compare voltage and an output providing a reset signal to the reset input of the gain stages. The reset circuit asserts the reset signal to force the gain stages back to the default state in response to the compare voltage transitioning to the second voltage level. The reset circuit negates the reset signal when the compare voltage is at the first voltage level.

The gain stages and the reset circuit may be collectively configured to oscillate the compare voltage between the first and second voltage levels while the sense voltage is less than the reference voltage, in which the frequency of oscillation is based on a magnitude of a difference between the sense voltage and the reference voltage up to a predetermined maximum frequency level.

The gain stages may include an input gain stage, an intermediate gain stage, and an output gain stage. The reset circuit may include a bias circuit that resets a control output of the input gain stage by pulling the control output to a bias level, and a switch circuit that resets a differential output of the intermediate gain stage by shorting together first and second polarities of the differential output.

A charge pump system according to one embodiment includes a charge pump that receives at least one pump clock and that provides a high voltage having a voltage level greater than a supply voltage, a voltage sensor having an input receiving the high voltage and providing a sense signal indicative thereof, and a self clocking comparator that provides a compare voltage used to develop each pump clock.

A method of generating a pump clock for a charge pump developing a high voltage output includes comparing a sense voltage indicative of the high voltage output of the charge pump with a reference voltage and providing a compare voltage indicative thereof, asserting the compare voltage to a first voltage level in a default state when the sense voltage is greater than the reference voltage, and asserting the compare voltage to a second voltage level in a reset state when the sense voltage is less than the reference voltage, forcing a reset condition to force transition back to the default state in response to the compare voltage transitioning to the second voltage so that the compare voltage transitions back to the first voltage level, and releasing the reset condition when in the default state.

The method may include oscillating the compare voltage between the first and second voltage levels while the sense voltage is less than the reference voltage at a frequency based on a magnitude of a difference between the sense voltage and the reference voltage up to a predetermined maximum frequency level.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The benefits, features, and advantages of the present invention will become better understood with regard to the following description, and accompanying drawings. The following description is presented to enable one of ordinary skill in the art to make and use the present invention as provided within the context of a particular application and its requirements.

A self clocking comparator for a charge pump as described herein integrates pump clock generation with the comparator to increase the maximum clock rate that the comparator can support while also ensuring that the clock runs no faster than this limiting rate. Such integration is achieved by using the output of the self clocking comparator to reset the internal state of the comparator. The comparator is configured to assert its output to a normal or default state when the charge pump output voltage is above a desired reference level. The comparator has a reset input such that when the reset input is asserted, the comparator is configured to return its output to the default state. When the charge pump output voltage falls below the reference level, the comparator output switches to a reset state that resets the comparator, so that it returns back to its default state thereby releasing the reset input. While the charge pump output voltage is below the reference voltage, there is a minimum delay before the comparator output changes state again causing the charge pump to go through another pump cycle. When the charge pump output is loaded, the comparator repeatedly toggles its output between the default and reset states generating a clock to drive the charge pump to increase the charge pump output voltage. The frequency of oscillation of the compare output of the comparator increases up to a predetermined maximum frequency as the charge pump output decreases.

The reset time, or the time that the comparator asserts its output to the reset state, is determined by a recovery speed in a comparator output stage which can be made to be very fast without cost of static current consumption since the reset state is chosen by design. The default time, or the time that the comparator asserts its output to the default state, is determined by the time the charge pump output takes to drop back below the reference plus the delay in a comparator input stage to bring its output below the threshold where a differential output of a comparator intermediate stage becomes negative. When the charge pump is heavily loaded, the charge pump output is slightly lower than the desired reference voltage and the default time is determined by the time required for the input stage to move its output a small voltage. This allows the comparator to support a much faster pump clock under heavy loads even with very little static power consumed in the input stage of the comparator and without creating problems related to charge pump output overshoot and stability.

Figure 1:
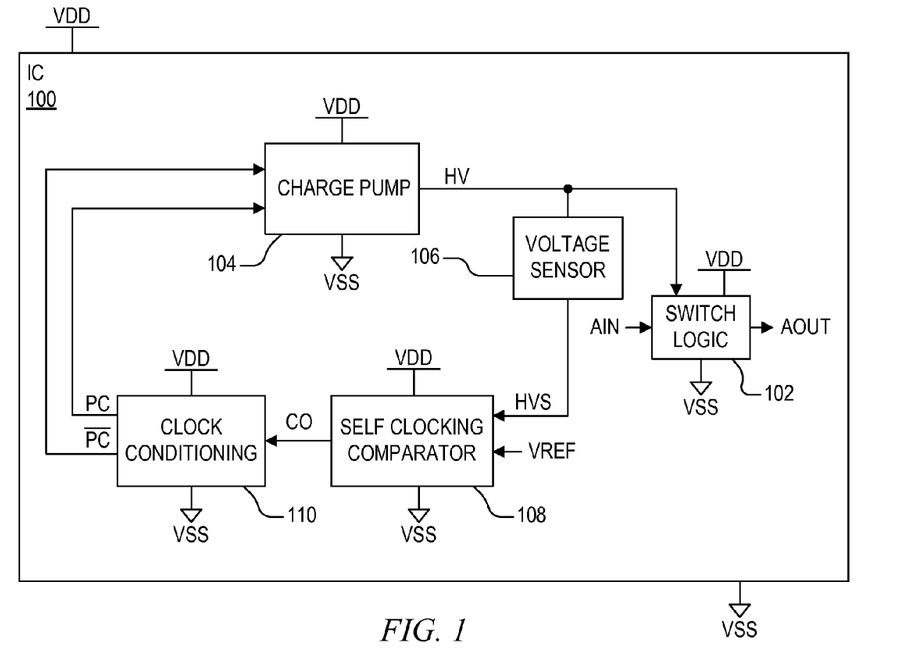
FIG. 1 is simplified block diagram of an integrated circuit or semiconductor chip incorporating a self clocking comparator according to one embodiment.

FIG. 1 is simplified block diagram of an integrated circuit (IC) 100 or semiconductor chip incorporating a self clocking comparator 108 according to one embodiment. In one embodiment, the IC 100 incorporates a microcontroller (MCU) that may be designed for embedded applications for any type of consumer or commercial electronic device. An MCU may include a processor core, memory, programmable input/output (I/O) peripherals, etc., for performing the desired functions. The IC 100, however, is not limited to MCU applications and be a microprocessor or the like, or may be any type of semiconductor chip performing any desired function for an electronic device. In one embodiment, the IC 100 is configured for low power applications, such as, for example, sensor applications including distributed sensors or wearable sensors or the like.

The IC 100 receives a source voltage VDD relative to a reference (or ground) voltage level VSS. In order to perform useful functions, it is often useful to generate a voltage that is higher than VDD. This is especially true when VDD is at a relative low voltage level, such as at about 1-2 V. For example, the IC 102 includes switch logic 102 for switching an analog input voltage (AIN) to an analog output voltage AOUT. Although the switch logic 102 may use the supply voltages VDD and VSS, the switching function has an associated impedance. As described further herein, the lower supply voltage results in a higher switching impedance thereby reducing switching efficiency and performance. The switch logic 102 is provided as an example of many other functions that may benefit from a voltage that is greater than the available supply voltage, such as, for example, operational amplifier input stages.

The IC 100 includes a charge pump 104 which generates a high voltage (HV) output that is provided to the switch logic 102. HV is set at a voltage level that improves the efficiency and performance of the switch logic 102 among other functions on the IC 100. In order to regulate the level of HV, it is sensed by a voltage sensor 106 providing an HVS sense signal to the self clocking comparator 108. The voltage sensor 106 may be implemented in any one of many different manners, such as a voltage divider (e.g., resistive divider or the like), or a voltage level shifter or the like. Thus, HVS has a level that is lower than and proportional to the voltage level of HV.

The comparator 108 compares HVS with a reference voltage VREF for developing a comparator clock output CO, which is provided to an input of a clock conditioning circuit 110. The clock conditioning circuit 110 may include level shifters, filters, and other timing and inverting logic for developing a corresponding pump clock (PC) signal and a corresponding inverted PC signal $\overline{PC}$. PC generally follows the same timing and state as CO, and $\overline{PC}$ is an inverted version of PC. The PC and $\overline{PC}$ signals are provided to clock the charge pump 104 as further described herein to develop the HV voltage. VREF has a voltage level such that HV is at about the desired voltage level when HVS is about equal to VREF. When HVS falls below VREF, the comparator 108 toggles CO to alternative states to corresponding toggle both of the pump clock signals PC and $\overline{PC}$. The toggling action pumps the charge pump 104 to increase HV back to the desired voltage level.

Figure 2:
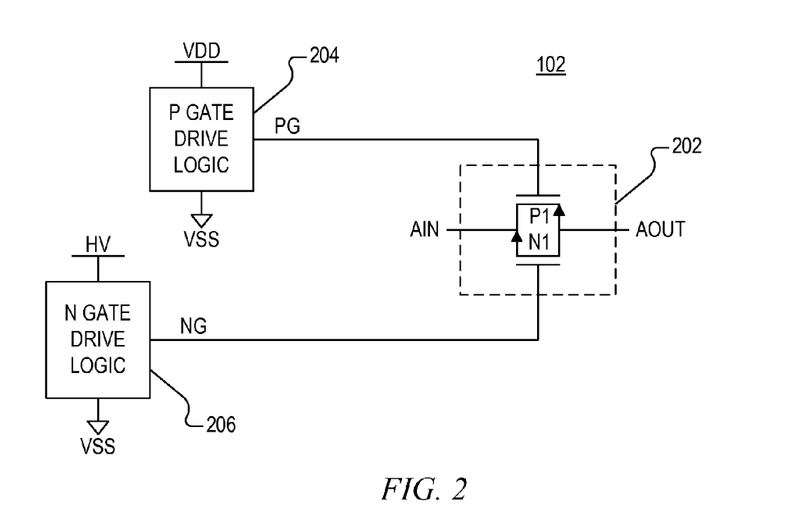
FIG. 2 is a simplified schematic and block diagram of the switch logic of FIG. 1 according to one embodiment.

FIG. 2 is a simplified schematic and block diagram of the switch logic 102 according to one embodiment. The switch logic 102 includes an analog switch 202, P gate drive logic 204 and N gate drive logic 206. The analog switch 202 includes a P-type or P-channel device P1 coupled in back-to-back configuration with a corresponding N-type or N-channel device N1. P1 and N1 are each shown as MOS type transistors, in which the drain of P1 is coupled to the source of N1 at an input receiving the analog input voltage AIN, and in which the source of P1 is coupled to the drain of N1 at an output providing the analog output voltage AOUT. The P gate drive logic 204 develops a gate drive signal PG to the gate of P1, and the N gate drive logic 206 develops a gate drive signal NG to the gate of N1.

In general, the analog switch 202 is turned off to isolate AIN from AOUT when PG is high and NG is low. The analog switch 202 is turned on to drive AOUT with AIN when PG is low and NG is high. PG going low fully turns on P1 so that P1 presents a relatively low impedance. Maximum efficiency and performance is achieved when the impedance through N1 is as low as possible. The maximum impedance through the analog switch 202 is determined by N1 when turned on. A higher voltage at the gate of N1 reduces the impedance through N1 to reduce impedance and increase switch performance. When the voltage of NG is below a minimum threshold, the lower voltage at the gate of N1 tends to exponentially increase impedance of N1 substantially reducing efficiency and performance of the analog switch 202. Although VDD has a sufficient voltage level for PG, in certain implementations and/or under certain operating conditions, VDD may fail to meet the minimum threshold causing reduced efficiency and performance of the analog switch 202. For certain low power applications, such failure to meet the minimum threshold is disadvantageous.

The N gate drive logic 206 receives HV from the charge pump 104 so that it may drive NG to a higher voltage level than VDD. In this manner, NG is driven to a voltage level that ensures optimal efficiency and performance for various configurations and operating conditions of the IC 100.

Figure 3:
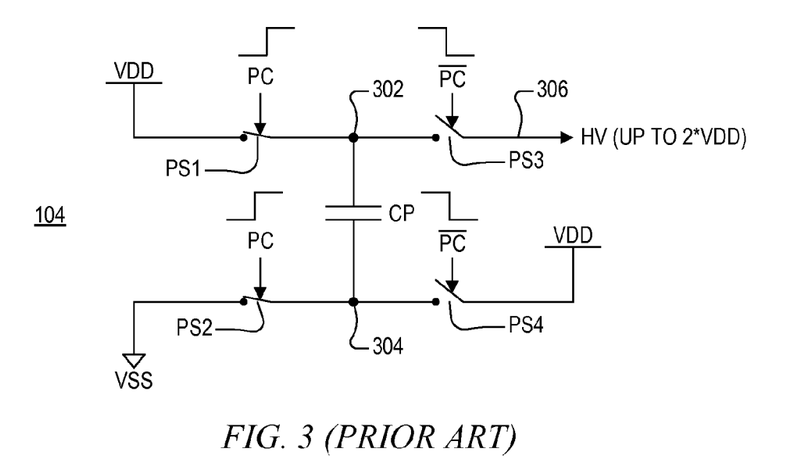
FIG. 3 is a schematic diagram of the charge pump according to a relatively simple conventional configuration.

FIG. 3 is a schematic diagram of the charge pump 104 according to a relatively simple conventional configuration. In this case, the charge pump 104 includes four single-pole, single-throw (SPST) pump switches PS1, PS2, PS3 and PS4 and a switched pump capacitor CP. The switched terminals of PS1 are coupled between VDD and a first node 302, the switched terminals of PS2 are coupled between VSS and a second node 304, the switched terminals of PS3 are coupled the first node 302 and an output node 306, and switched terminals of PS4 are coupled between the second node 304 and VDD. The capacitor CP is coupled between the nodes 302 and 304. The pump clock signal PC is provided to control the switches PS1 and PS2, and the inverted pump clock signal $\overline{PC}$ is provided to control the switches PS3 and PS4.

In operation, when PC is high and $\overline{PC}$ is low, the switches PS1 and PS2 are closed and the switches PS3 and PS4 are opened. In this first state, the capacitor CP is coupled between VDD and VSS and thus is charged up to the voltage level of VDD. When $\overline{PC}$ is high and PC is low, the switches PS1 and PS2 are opened and the switches PS3 and PS4 are closed. In this second state, the capacitor CP is coupled between VDD and the output node 306, so that the voltage level of CP is added to VDD to develop the output voltage HV. If CP is charged to the voltage level of VDD, then HV may be charged up to twice the voltage level of VDD. The frequency and duty cycle of switching of the PC and $\overline{PC}$ signals may be controlled, and the capacitance of CP may be selected, to develop HV at any suitable voltage level between VDD and 2*VDD for a given configuration.

The charge pump 104 illustrated in FIG. 3 is relatively simple and is provided only as an example of switched capacitor charge pumps. Many different types of switched capacitor configurations, including more complicated switched capacitor configurations, are known and may be used in different configurations depending upon the specific applications. The present disclosure is not limited to the type, size or complexity of the charge pump 104.

Figure 4:
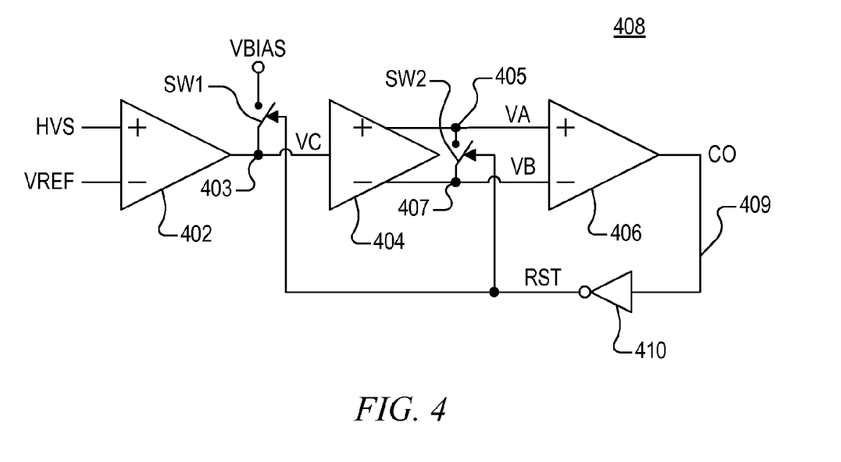
FIG. 4 is a schematic diagram of a self clocking comparator according to one embodiment which may be used as the comparator of FIG. 1.

FIG. 4 is a schematic diagram of a self clocking comparator 408 according to one embodiment which may be used as the comparator 108. The self clocking comparator 408 illustrated in FIG. 4 includes 3 gain stages 402, 404 and 406, in which 402 is an input gain stage, 404 is an intermediate gain stage, and 406 is an output gain stage. The comparator 104 further includes a first SPST switch SW1, and second SPST switch SW2, and an inverter 410. The gain stage 402 has a differential input including positive (or non-inverting) input receiving HVS, a negative (or inverting) input receiving VREF, and has a single-ended output coupled to a node 403 developing a control voltage VC. SW1 has its switched terminals coupled between a bias voltage VBIAS and node 403.

The gain stage 404 has a single-ended input coupled to node 403 for receiving VC, and has a differential output including a positive output coupled to a node 405 developing a voltage VA, and a negative output coupled to a node 407 developing a voltage VB. In this manner, VA and VB are the positive and negative polarities of a differential output of the gain stage 404. Switch SW2 has its switched terminals coupled between nodes 405 and 407. The gain stage 406 has a differential input including a positive input coupled to node 405 for receiving VA, a negative input coupled to node 407 for receiving VB, and a single-ended output coupled to a node 409 developing the comparator output CO. Node 409 is coupled to the input of the inverter 410, having its output developing a reset signal RST provided to control the switches SW1 and SW2.

VBIAS is at an appropriate voltage level up to VDD to reset the state of the gain stage 404. The switches SW1 and SW2 may each be implemented with NMOS or PMOS type transistors or the like. The inverter 410 may also be implemented using a CMOS stage (PMOS and NMOS) or any other suitable manner for fast switching.

In operation of the self clocking comparator 408, when HVS is above VREF, the comparator 408 is in a first or default state. In the default state, the first gain stage 402 asserts VC at a relatively high voltage level, which causes the second gain stage 404 to assert its output high (e.g., VA>VB), which in turn causes the gain stage 406 to assert CO high. When CO is high, RST is low so that both switches SW1 and SW2 are opened during the default state.

When HVS falls below VREF, the gain stage 402 pulls VC to a lower voltage level, which causes the gain stage 404 to pull its output low (e.g., VA<VB). In response, the gain stage 406 pulls CO low, and the inverter 408 pulls RST high. At this point, the state of the comparator 408 is in a reset state. When RST goes high, it closes both switches SW1 and SW2. When closed, SW1 pulls VC to the voltage level of VBIAS to effectively force the "default" state of the gain stage 404. Also, SW2 closing shorts the differential outputs of the gain stage 404 together. The gain stage 406 is configured such that when its inputs are equal to each other, which occurs when SW2 is closed (so that VA=VB), then the gain stage 406 pulls CO back high. When CO goes back high, RST is pulled low to open the switches SW1 and SW2 so that the comparator 408 is back into its default state.

In summary, when HVS falls below VREF, the self clocking comparator 408 toggles its output from high to low and then back high again to assert a pulse on CO and thus on both of the pump clock signals PC and $\overline{PC}$. PC follows the state of CO with a minor delay. $\overline{PC}$ is a synchronized and inverted version of PC. As shown in FIG. 3, toggling the pump clock signals PC and $\overline{PC}$ pumps the charge pump 104 to increase HV by an incremental amount. If HVS increases above VREF, then the comparator 408 stays in the default state until it falls again below VREF. If HVS is not increased above VREF, then the comparator 408 cycles between the default and reset states again to increase HV. HV rises above its regulated voltage level or the comparator 408 oscillates to maintain HV at or near the regulated voltage level.

The reset time, or when CO is low, is determined by the recovery speed of the gain stage 406, which can be made sufficiently fast without the cost of static current consumption since the reset state is chosen by design. The default time, or when CO is high, is determined by the time the charge pump output HV causes HVS to drop below VREF plus the delay of the gain stage 402 to bring VC below a threshold that causes the gain stage 404 asserts its output negative. When the charge pump 104 is heavily loaded, HV is slightly lower than its regulated level and the default time is determined by the time it takes for the gain stage 402 to move its output by a small voltage increment. This allows the self clocking comparator 408 to support a much faster pump clock under heavy loads even with very little static power consumed by the gain stage 402 and without creating problems related to charge pump output overshoot and stability.

When HVS falls below VREF, the comparator 408 oscillates CO to generate the pump action to increase HV, and thus HVS back above VREF. The frequency of oscillation of CO increases with increasing magnitude of the difference between HVS and VREF up to a predetermined maximum frequency level. In this manner, the frequency of CO, and thus of the pump clocks PC and $\overline{PC}$, increases with increasing load of the charge pump 104. The charge pump 104 is designed to handle the average and maximum current loads expected in a given configuration. The comparator 408 is designed to generate CO with the appropriate timing (e.g., frequency of CO) to enable the charge pump 104 to meet its load conditions.

Figure 5:
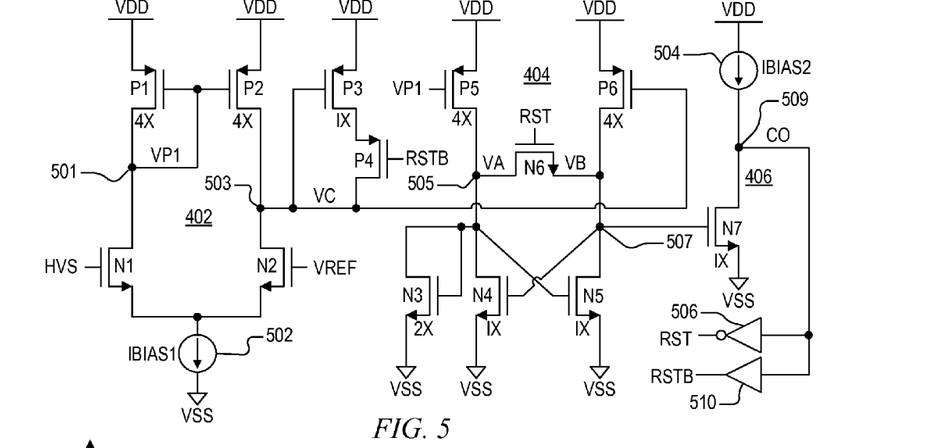
FIG. 5 is a more detailed schematic diagram of a self clocking comparator according to one embodiment which may be used as the comparator of FIG. 1.

FIG. 5 is a more detailed schematic diagram of a self clocking comparator 508 according to one embodiment which may be used as the comparator 108. The comparator 508 includes PMOS transistors P1, P2, P3, P4, P5 and P6 (P1-P6) and NMOS transistors N1, N2, N3, N4, N5, N6 and N7 (N1-N7). The comparator 508 further includes current sources 502 and 504 providing bias current IBIAS1 and IBIAS2, respectively. The comparator 508 further includes an inverter 506 and a buffer 510.

The comparator 508 is a more specific implementation of the comparator 408, including the gain stages 402, 404 and 406. The gain stage 402 includes P1, P2, N1 and N2 along with the current source 502. The gain stage 404 includes P5, P6, and N3-N5. The gain stage 406 includes N7 and the current source 504. The switch SW1 for selectively coupling VBIAS is implemented by P3 and P4. The switch SW2 for shorting the differential outputs of the gain stage 404 is implemented by N6. The inverter 506 and the buffer 510 serve a similar function as the inverter 410.

The transistors P1-P6 and N3-N5 and N7 are shown with size values relative to a unit size of 1×. P1, P2, P5 and P6 each have a size of 4×. P3 has a unit size of 1×. N3 has a size of 2×, and N4, N5 and N7 each have a unit size of 1×. The transistors N1, N2, P4 and N6 are not shown with a size value since their sizes may be configured according to particular implementations. The current sources 502 and 504 are configured such that IBIAS2>k*IBIAS1, in which "k" is a gain constant. In the illustrated embodiment with 4× sized P1, P2, P5 and P6, IBIAS2 is made greater than ¼ IBIAS1 (i.e., k=¼) to force CO high during its default state. In order to achieve sharper transitions of CO, IBIAS2>IBIAS1. In one embodiment, IBIAS2≈8*IBIAS1 to ensure fast transitions of CO between the default and reset states. It is understood that the gain factor "k" between IBIAS1 and IBIAS2 may be any suitable value depending upon the particular configuration.

For the gain stage 402, P1 and P2 have their sources coupled to VDD, and their gates coupled together at a node 501 developing a voltage VP1. The drain of P1 is coupled to node 501 (in which P1 is diode-coupled), where node 501 is coupled to the drain of N1. The drain of P1 is coupled to a node 503 developing the voltage VC, which is further coupled to the drain of N2. The sources of N1 and N1 are coupled together at an input of the current source 502, which has its output coupled to VSS. The current source this sinks the current IBIAS 1 via the source of N1 and N2 to VSS. The gate of N1 receives HVS and the gate of N2 receives VREF.

P3 has its source coupled to VDD and its drain coupled to the source of P4, having its drain coupled to node 503. The gate of P3 is coupled to node 503 and the gate of P4 receives an inverted reset signal RSTB provided at the output of the buffer 510. When CO is pulled low, P4 is turned on and P3 is sized to pull the voltage of VC to a bias voltage level relative to VDD.

For the gain stage 404, P5 and P6 have their sources coupled to VDD. The drain of P5 is coupled to a node 505, which is further coupled to the drains of N3 and N4 and to the gates of N3 and N5. The drain of P6 is coupled to a node 507, which is further coupled to the drain of N5 and to the gate of N4. The sources of N3, N4 and N5 are coupled to VSS. The gate of P5 is coupled to node 501 for receiving voltage VP1. The gate of P6 is coupled to node 503 for receiving the voltage VC. Node 505 develops the voltage VA and node 507 develops the voltage VB.

It is noted that during switching operation of the self clocking comparator 508, the voltage level of VP1 remains relatively constant. In the illustrated embodiment, VP1 is used as a bias voltage provided to the gate of P5. In this manner, the input gain stage 402 develops the single-ended output VC. In an alternative embodiment, a separate bias voltage may be generated and provided to the gate of P5.

N6 has its drain coupled to node 505, its source coupled to node 507, and its gate receiving a reset signal RST provided at the output of the inverter 506. N6 thus performs a similar function as the switch SW2.

For the gain stage 406, the current source 504 has its input coupled to VDD, its output coupled to the output node 509 developing CO, in which the output node 509 is further coupled to the drain of N7. N7 has its gate coupled to node 507 for receiving voltage VB and its source coupled to VSS. The current source 504 sources the bias current IBIAS to the output node 509.

The inverter 506 inverts CO to provide the reset signal RST. The buffer 510 buffers CO to provide the inverted reset signal RSTB. The inverter 506 and the buffer 510 have substantially the same delay and both are responsive to CO to drive RST and RSTB to alternative logic levels with similar timing.

The combined current through N1 and N2 is IBIAS1. Assuming a substantially equal voltage of HVS and VREF, IBIAS1 is about equally split between N1 and N2 so that VP1 and VC have about the same voltage. The current of IBIAS1 is also about equally split between P1 and P2. Since P5 and P6 each have gate and source voltages at about the same as P1 and P2, a current of IBIAS1 also splits between P5 and P6 and flows through N3-N5. The node 507 develops a voltage that does not turn N7 on (or at least N7 is only partially on), and the current IBIAS2 is sufficiently high so that CO is held high in the balanced state.

When HVS is greater than VREF, more current flows through N1 and less through N2 so that the voltage of VC increases. When VC is at a higher voltage, P6 develops less current to the node 507. In this case, CO remains high and the comparator 508 remains in the default state.

When HVS falls below VREF, less current flows through N1 and more through N2 which tends to reduce the voltage of VC. A lower voltage of VC causes P6 to turn on more so that more current flows through P6. As P6 turns on more, the voltage of VB increases turning on N7, which pulls CO low. When CO goes low, RSTB goes low turning on P4 to pull VC back high via P3 and P4. Also, RST goes high turning on N6 which shorts VA and VB together. This brings the comparator 508 back to the default state in which N7 is turned off so that CO goes back high.

In this manner, the comparator 508 stays in the default state while HVS is above VREF, and toggles between the default and reset states while HVS is below VREF. As previously described, the frequency of oscillation of CO increases with increasing magnitude of the difference between HVS and VREF while HVS is less than VREF.

Figure 6:
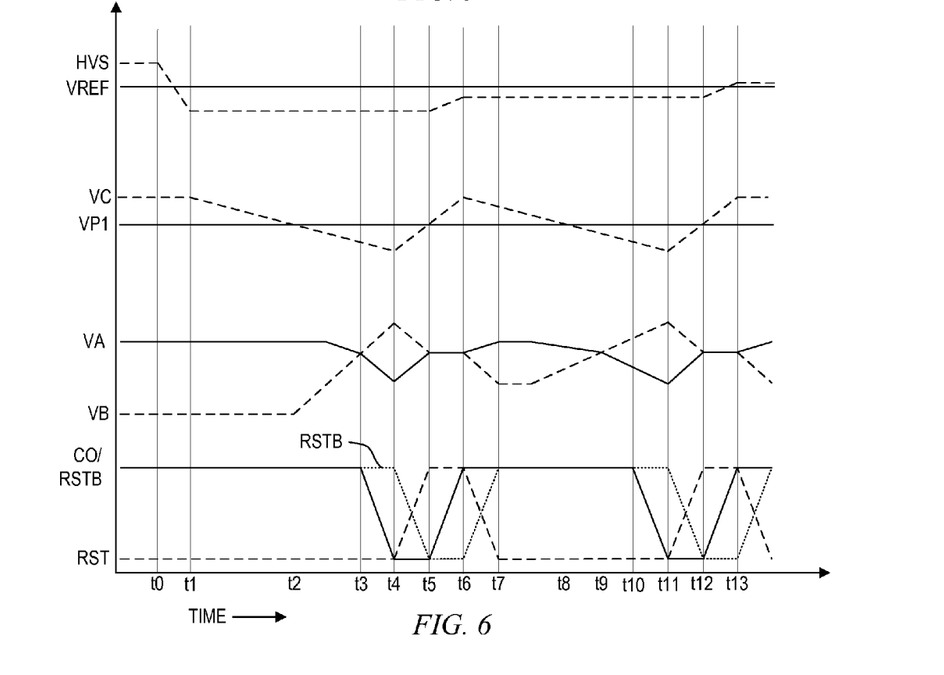
FIG. 6 is a series of timing diagrams illustrating operation of the self clocking comparator of FIG. 5.

FIG. 6 is a series of timing diagrams plotting the voltage levels of VREF, HVS, VP1, VC, VA, VB, CO, RST and RSTB versus time illustrating operation of the self clocking comparator 508. The timing diagrams are simplified to illustrate general relationships between the various signals during pump action in which signal timing and magnitudes are not drawn to scale. The timing of certain of the voltage signals, for example, is stretched in order to more readily convey switching operation for purposes of clarity of explanation. Also, the signal changes are simplified to linear form. Actual timing and magnitudes will vary for different configurations and implementations.

At an initial time t0, HVS is above VREF but begins to fall. The comparator 508 is in its default state and CO is asserted high. At subsequent time t1, HVS falls below VREF and VC begins to decrease relative to VP1. At about time t2, VP1 and VC cross so that VB increases and VA eventually decreases. VA and VB cross at about time t3 and CO begins to fall. After a small delay at about time t4, CO is low, RST begins going high while RSTB begins going low, and VC begins to increase relative to VP1. At about time t5, RST is high, RSTB is low, and VA and VB are shorted together. Also, CO begins to go high and the pumping action causes HVS to increase. At about time t6, CO is high, and RST begins going low while RSTB begins going high. The comparator 508 is back to the default state at about time t7 after a short delay. However, since HVS is still below VREF at time t6, VC decreases again.

After time t7, VC and VP1 eventually cross at about time t8 while VA is decreasing and VB is increasing. VA and VB cross at about time t9, and at subsequent time t10 after a short delay, CO begins going low. After a small delay at about time t11, CO is low, RST begins going high while RSTB begins going low, and VC begins to increase relative to VP1. Also, VB decreases while VA increases. At about time t12, RST is high, RSTB is low, CO begins going high and VA is shorted to VB. The toggling of CO causes an increase of HVS above VREF between times t12 and t13. At about time t13, CO is high, and RST and RSTB both begin returning to their default states for the default state of the comparator 508. VC is greater VP1, and VA rises while VB falls. Operation remains in the default state while HVS remains above VREF, and additional pump cycles repeat if and when HVS falls below VREF.

Although a particular configuration is shown with three gain stages, a similar effect may be achieved with any number of gain stages including only two gain stages. A self clocking comparator for a charge pump as described herein has a default state when the charge pump output is sufficiently high, and transitions to a reset state when the charge pump output falls below a reference level. The self clocking comparator resets itself back to the default state after transitioning to the reset state. Reset is performed in a way such that when the comparator output toggles to the default state and reset is released, it does not immediately reassert reset if the charge pump output goes back high. Otherwise, the self clocking comparator oscillates to clock the charge pump at a sufficient rate to increase its output.

Although the present invention has been described in considerable detail with reference to certain embodiments thereof, it is understood that versions and variations are possible and contemplated so that the general principles defined herein may be applied to other embodiments. Those skilled in the art should appreciate that they can readily use the disclosed conception and specific embodiments as a basis for designing or modifying other structures for providing the same purposes of the present invention without departing from the spirit and scope of the invention. Therefore, the present invention is not intended to be limited to the particular embodiments shown and described herein, but is to be accorded the widest scope consistent with the principles and novel features herein disclosed.

The invention claimed is:

1. A self clocking comparator for clocking a charge pump providing a high voltage output, comprising:

a plurality of gain stages having a first input that receives a sense voltage indicative of the high voltage output of the charge pump, having a second input that receives a reference voltage, having a reset input, and having an output providing a compare voltage;

wherein said plurality of gain stages assert said compare voltage to a first voltage level in a default state when said sense voltage is greater than said reference voltage, and wherein said plurality of gain stages assert said compare voltage to a second voltage level in a reset state when said sense voltage is less than said reference voltage; and a reset circuit having an input receiving said compare voltage and having an output providing a reset signal to said reset input of said plurality of gain stages, wherein said reset circuit asserts said reset signal to force said plurality of gain stages back to said default state in response to said compare voltage transitioning to said second voltage level, and wherein said reset circuit negates said reset signal when said compare voltage is at said first voltage level.

2. The self clocking comparator of claim 1, wherein said plurality of gain stages and said reset circuit are collectively configured to oscillate said compare voltage between said first and second voltage levels while said sense voltage is less than said reference voltage, in which said frequency of oscillation is based on a magnitude of a difference between said sense voltage and said reference voltage up to a predetermined maximum frequency level.

3. The self clocking comparator of claim 1, wherein said plurality of gain stages comprise:

an input gain stage having a first input that receives said sense voltage, having a second input that receives said reference voltage, and having a control output indicative of a difference between said sense voltage and said reference voltage;
an intermediate gain stage having an input coupled to said control output of said input gain stage and having a differential output indicative of a voltage level of said control output; and
an output gain stage having a differential input coupled to said differential output of said intermediate stage and having an output providing said compare voltage.

4. The self clocking comparator of claim 3, wherein said reset circuit comprises:
a bias circuit that resets said control output of said input gain stage by pulling said control output to a bias level; and
a switch circuit that resets said differential output of said intermediate gain stage by shorting together first and second polarities of said differential output.

5. The self clocking comparator of claim 3, wherein said input gain stage comprises:
a first P-type transistor having a source coupled to an upper supply voltage, and having a drain and gate coupled together at a first node;
a second P-type transistor having a source coupled to said upper supply voltage, having a gate coupled to said first node, and having a drain coupled to said control output;
a first N-type transistor having a drain coupled to said first node, having a gate receiving said sense voltage, and having a source coupled to a second node;
a second N-type transistor having a drain coupled to said control output, having a gate receiving said reference voltage, and having a source coupled to said second node; and
a first current source coupled to sink a first bias current from said second node to a lower supply voltage.

6. The self clocking comparator of claim 5, wherein said intermediate gain stage comprises:
a third P-type transistor having a source coupled to an upper supply voltage, having a gate receiving a bias voltage, and having a source coupled to a third node;
a fourth P-type transistor having a source coupled to said upper supply voltage, having a gate coupled to said control node, and having a drain coupled to a fourth node;
a third N-type transistor having a drain coupled to said third node, having a gate coupled to said fourth node, and having a source coupled to said lower supply voltage; and
a fourth N-type transistor having a drain coupled to said fourth node, having a gate coupled to said third node, and having a source coupled to said lower supply voltage.

7. The self clocking comparator of claim 6, wherein said intermediate gain stage further comprises a fifth N-type transistor having a drain and gate coupled together at said third node, and having a source coupled to said lower supply voltage.

8. The self clocking comparator of claim 6, wherein said gate of said third P-type transistor is coupled to said first node.

9. The self clocking comparator of claim 6, wherein said output gain stage comprises:
a fifth N-type transistor having a drain coupled to an output node providing said compare voltage, having a gate coupled to said fourth node, and having a source coupled to said lower supply voltage; and
a second current source coupled to source a second bias current to said output node.

10. The self clocking comparator of claim 9, wherein said first, second, third and fourth P-type devices are four times the size of said third, fourth and fifth N-type transistors, and wherein said second bias current is greater than one-fourth of said first bias current.

11. The self clocking comparator of claim 9, wherein said reset circuit comprises:
a pull-up circuit that pulls said control output of said first gain stage towards said upper supply voltage in response to said compare voltage transitioning to said second voltage level; and
a switch coupled between said third and fourth nodes that shorts said third and fourth nodes together in response to said compare voltage transitioning to said first voltage level.

12. A charge pump system, comprising:
a charge pump that receives at least one pump clock and that provides a high voltage having a voltage level greater than a supply voltage;
a voltage sensor having an input receiving said high voltage and providing a sense voltage indicative thereof; and
a self clocking comparator, comprising:
a plurality of gain stages having a first input that receives said sense voltage, having a second input that receives a reference voltage, having a reset input, and having an output providing a compare voltage;
wherein said plurality of gain stages assert said compare voltage to a first voltage level in a default state when said sense voltage is greater than said reference voltage, and wherein said plurality of gain stages assert said compare voltage to a second voltage level in a reset state when said sense voltage is less than said reference voltage; and
a reset circuit having an input receiving said compare voltage and having an output providing a reset signal to said reset input of said plurality of gain stages, wherein said reset circuit asserts said reset signal to force said plurality of gain stages back to said default state in response to said compare voltage transitioning to said second voltage level, and wherein said reset circuit negates said reset signal when said compare voltage is at said first voltage level.

13. The charge pump system of claim 12, further comprising a clock conditioning circuit having an input receiving said compare voltage and having an output providing a first pump clock that follows said compare voltage and a second pump clock that is a synchronized and inverted version of said first pump clock.

14. The charge pump system of claim 12, wherein said plurality of gain stages and said reset circuit are collectively configured to oscillate said compare voltage between said first and second voltage levels while said sense voltage is less than said reference voltage, in which said frequency of oscillation is based on a magnitude of a difference between said sense voltage and said reference voltage up to a predetermined maximum frequency level.

15. The charge pump system of claim 12, wherein said plurality of gain stages comprises:
an input gain stage having a first input that receives said sense voltage, having a second input that receives said reference voltage, and having a control output indicative of a difference between said sense voltage and said reference voltage;

an intermediate gain stage having an input coupled to said control output of said input gain stage and having a differential output indicative of a level of said control output; and an output gain stage having a differential input coupled to said differential output of said intermediate stage and having an output coupled to an output node that develops said compare voltage, wherein said compare voltage is used to develop said at least one pump clock.

16. The charge pump system of claim 15, wherein said reset circuit comprises:

a bias circuit that resets said control output of said input gain stage by pulling said control output to a bias level; and a switch circuit that resets said differential output of said intermediate gain stage by shorting together first and second polarities of said differential output.

17. A method of generating a pump clock for a charge pump developing a high voltage output, comprising:

comparing a sense voltage indicative of the high voltage output of the charge pump with a reference voltage and providing a compare voltage indicative thereof;

wherein said providing a compare voltage comprises asserting the compare voltage to a first voltage level in a default state when the sense voltage is greater than the reference voltage, and asserting the compare voltage to a second voltage level in a reset state when the sense voltage is less than the reference voltage;

forcing a reset condition to force transition back to the default state in response to the compare voltage transitioning to the second voltage so that the compare voltage transitions back to the first voltage level; and releasing the reset condition when in the default state.

18. The method of claim 17, wherein said comparing, providing, asserting, forcing and releasing comprise oscillating the compare voltage between the first and second voltage levels while the sense voltage is less than the reference voltage at a frequency based on a magnitude of a difference between the sense voltage and the reference voltage up to a predetermined maximum frequency level.

19. The method of claim 17, wherein said comparing a sense voltage indicative of the high voltage output of the charge pump with a reference voltage and providing a compare voltage indicative thereof comprises:

amplifying a difference between the sense voltage and the reference voltage and providing a control output indicative thereof;

providing a differential voltage indicative of a voltage level of the control output; and asserting the compare voltage to have the first voltage level when the sense voltage is greater than the reference voltage and asserting the compare voltage to a second voltage level when the sense voltage falls below the reference voltage.

20. The method of claim 17, further comprising dividing down the high voltage output of the charge pump to provide the sense voltage.

* * * * *